United States Patent
Philipp et al.

(10) Patent No.: US 7,372,725 B2
(45) Date of Patent: May 13, 2008

(54) INTEGRATED CIRCUIT HAVING RESISTIVE MEMORY

(75) Inventors: Jan Boris Philipp, Peekskill, NY (US); Thomas Happ, Tarrytown, NY (US)

(73) Assignee: Infineon Technologies AG, Munich (DE)

( * ) Notice: Subject to any disclaimer, the term of this patent is extended or adjusted under 35 U.S.C. 154(b) by 202 days.

(21) Appl. No.: 11/204,201

(22) Filed: Aug. 15, 2005

(65) Prior Publication Data

US 2007/0047296 A1     Mar. 1, 2007

(51) Int. Cl.
*G11C 11/00*     (2006.01)

(52) U.S. Cl. .................. 365/163; 365/148; 365/189.01; 365/207

(58) Field of Classification Search ................ 365/163, 365/148, 189.01, 207
See application file for complete search history.

(56) References Cited

U.S. PATENT DOCUMENTS

| | | | |
|---|---|---|---|
| 6,075,719 A | 6/2000 | Lowrey et al. | |
| 6,687,153 B2 | 2/2004 | Lowrey | |
| 6,759,267 B2 | 7/2004 | Chen | |
| 6,937,507 B2* | 8/2005 | Chen | 365/163 |
| 6,965,521 B2* | 11/2005 | Li et al. | 365/148 |
| 7,068,534 B2* | 6/2006 | Bedeschi et al. | 365/163 |
| 7,085,154 B2 | 8/2006 | Cho et al. | |
| 2004/0114419 A1 | 6/2004 | Lowrey et al. | |
| 2004/0145944 A1* | 7/2004 | Pashmakov | 365/166 |
| 2004/0246804 A1 | 12/2004 | Cho et al. | |
| 2004/0246808 A1 | 12/2004 | Cho et al. | |
| 2005/0117387 A1 | 6/2005 | Hwang et al. | |
| 2005/0117388 A1 | 6/2005 | Cho et al. | |
| 2005/0169093 A1 | 8/2005 | Choi et al. | |
| 2006/0279979 A1* | 12/2006 | Lowrey et al. | 365/148 |

FOREIGN PATENT DOCUMENTS

| | | |
|---|---|---|
| DE | 10 2004 039 977 | 3/2005 |
| EP | 1 308 960 | 5/2004 |
| EP | 1 426 975 | 6/2004 |

OTHER PUBLICATIONS

"A Nonvolatile Memory Based on Reversible Phase Changes Between fcc and hcp", Dong-Ho Ahn, et al., 2005. (3 pgs.).

* cited by examiner

*Primary Examiner*—Anh Phung
*Assistant Examiner*—Toan Le
(74) *Attorney, Agent, or Firm*—Dicke, Billig & Czaja, PLLC

(57) ABSTRACT

A memory device including a memory cell, a first circuit, and a second circuit. The memory cell includes phase-change material. The first circuit is configured to provide pulses to the phase-change material and to program each of more than two states into the memory cell. The second circuit is configured to sense the present state of the memory cell and provide signals that indicate the present state of the memory cell. The first circuit programs each of the more than two states into the memory cell based on the signals.

37 Claims, 6 Drawing Sheets

US 7,372,725 B2

INTEGRATED CIRCUIT HAVING RESISTIVE MEMORY

BACKGROUND

Phase-change memories are based on phase-change materials that exhibit at least two different states. Phase-change material may be used in memory cells to store bits of data. The states of phase-change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase-change materials exhibit more than one crystalline state, e.g. a face-centered cubic (FCC) state and a hexagonal closest packing (HCP) state. These two crystalline states have different resistivities and may be used to store bits of data. In the following description, the amorphous state generally refers to the state having the higher resistivity, and the crystalline state generally refers to the state having the lower resistivity.

Phase change in the phase-change materials may be induced reversibly. In this way, the memory may change from the amorphous state to the crystalline state and from the crystalline state to the amorphous state, in response to temperature changes. The temperature changes to the phase-change material may be achieved in a variety of ways. For example, a laser can be directed to the phase-change material, current may be driven through the phase-change material, or current can be fed through a resistive heater adjacent the phase-change material. In any of these methods, controllable heating of the phase-change material causes controllable phase change within the phase-change material.

A phase-change memory including a memory array having a plurality of memory cells that are made of phase-change material may be programmed to store data utilizing the memory states of the phase-change material. One way to read and write data in such a phase-change memory device is to control a current and/or a voltage pulse that is applied to the phase-change material. The level of current and/or voltage generally corresponds to the temperature induced within the phase-change material in each memory cell.

In order to achieve higher density phase-change memories, a phase-change memory cell can store multiple bits of data. Multi-bit storage in a phase-change memory cell can be achieved via programming the phase-change material to have intermediate resistance values or states. If the phase-change memory cell is programmed to three different resistance levels, 1.5 bits of data per cell can be stored. If the phase-change memory cell is programmed to four different resistance levels, 2 bits of data per cell can be stored, and so on. For simplicity, the description in this disclosure is substantially focused on four different resistance levels or states and 2 bits of data per cell. However, this is for illustrative purposes only and not intended to limit the scope of the invention. In principle it is possible to store 3 or more states. To program a phase-change memory cell to an intermediate resistance value, the amount of crystalline material coexisting with amorphous material and hence the cell resistance is controlled via a suitable write strategy.

For these and other reasons there is a need for the invention.

SUMMARY

One aspect of the present invention provides a memory device including a memory cell, a first circuit, and a second circuit. The memory cell includes phase-change material. The first circuit is configured to provide pulses to the phase-change material and to program each of more than two states into the memory cell. The second circuit is configured to sense the present state of the memory cell and provide signals that indicate the present state of the memory cell. The first circuit programs each of the more than two states into the memory cell based on the signals.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
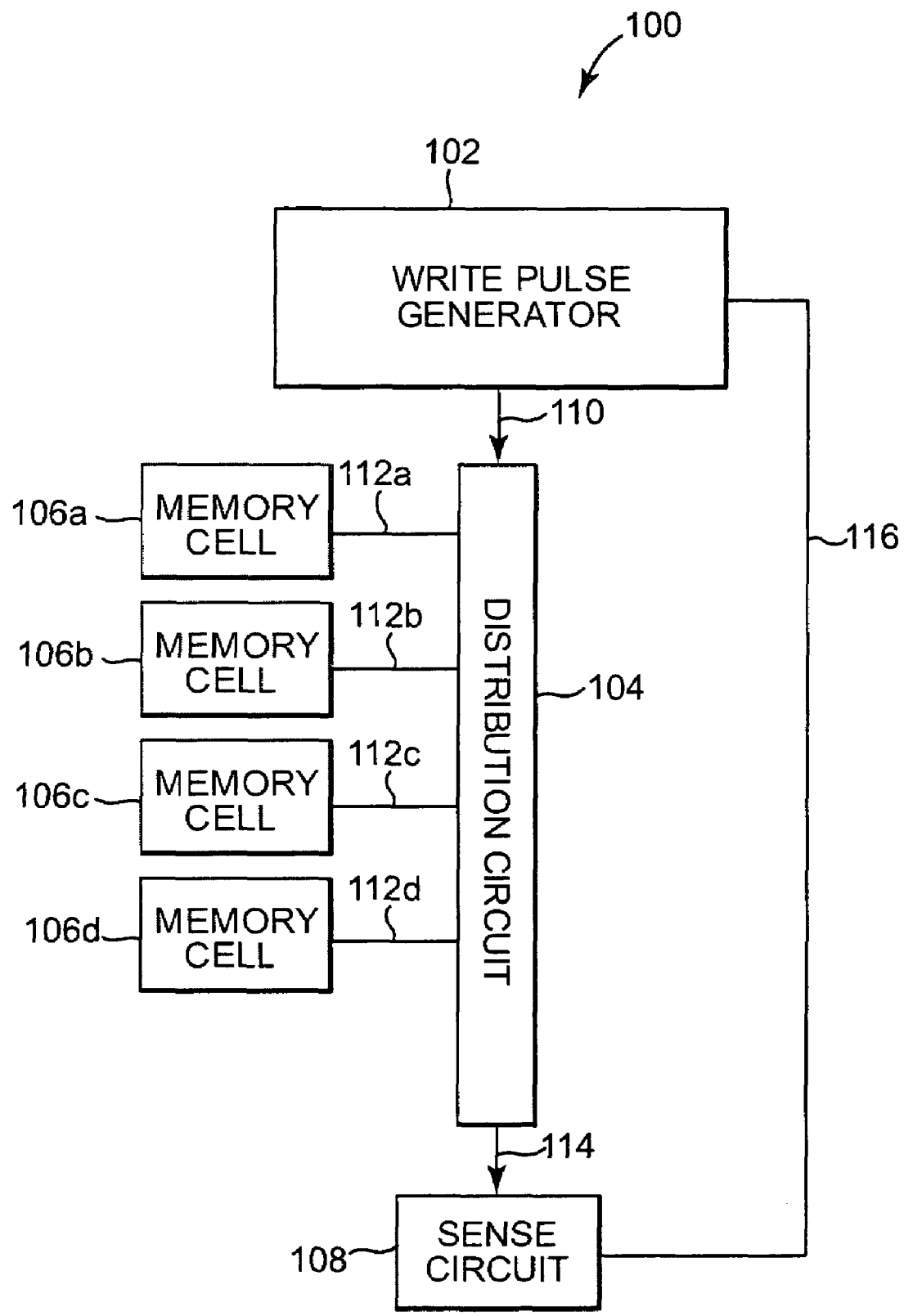
FIG. 1 is a block diagram illustrating one embodiment of a memory device according to the present invention.

FIG. 1 is a block diagram illustrating one embodiment of a memory device 100 according to the present invention. Memory device 100 includes a write pulse generator 102, a distribution circuit 104, memory cells 106a, 106b, 106c, and 106d, and a sense circuit 108. Each of the memory cells 106a-106d is a phase-change memory cell that stores data based on the amorphous and crystalline states of phase-change material in the memory cell. Also, each of the memory cells 106a-106d can be programmed into more than two states via programming the phase-change material to have intermediate resistance values. To program one of the memory cells 106a-106d to an intermediate resistance value, the amount of crystalline material coexisting with amorphous material—and hence the cell resistance—is controlled via a suitable write strategy.

Write pulse generator 102 provides pulses to memory cells 106a-106d and programs each of more than two resistance levels or states into the phase-change material of each of the memory cells 106a-106d. Sense circuit 108 senses the more than two states of the phase-change material and provides signals that indicate the more than two states of the phase-change material in a memory cell. Write pulse generator 102 receives the signals and programs each of the more than two states into the phase-change material based on the signal feedback.

Write pulse generator 102 is electrically coupled to distribution circuit 104 via write pulse path 110. Distribution circuit 104 is electrically coupled to each of the memory cells 106a-106d via cell paths 112a-112d. Distribution circuit 104 is electrically coupled to memory cell 106a via cell path 112a. Distribution circuit 104 is electrically coupled to memory cell 106b via cell path 112b. Distribution circuit 104 is electrically coupled to memory cell 106c via cell path 112c. Distribution circuit 104 is electrically coupled to memory cell 106d via cell path 112d. In addition, distribution circuit 104 is electrically coupled to sense circuit 108 via sense path 114, and sense circuit 104 is electrically coupled to write pulse generator 102 via signal path 116.

Each of the memory cells 106a-106d include a phase-change material that may be changed from an amorphous state to a crystalline state or from a crystalline state to an amorphous state under the influence of temperature change. The amount of crystalline material coexisting with amorphous material in the phase-change material of one of the memory cells 106a-106d thereby defines more than two states for storing data within memory device 100. In the amorphous state, a phase-change material exhibits significantly higher resistivity than in the crystalline state. Therefore, the more than two states of memory cells 106a-106d differ in their electrical resistivity. In one embodiment, the more than two states can be three states and a trinary system can be used, wherein the three states are assigned bit values of "0", "1", and "2". In one embodiment, the more than two states are four states that can be assigned multi-bit values, such as "00", "01", "10", and "11". In other embodiments, the more than two states can be any suitable number of states in the phase-change material of a memory cell.

In one embodiment, write pulse generator 102 provides voltage pulses to distribution circuit 104 via write pulse path 110 and distribution circuit 104 controllably directs the voltage pulses to memory cells 106a-106d via cell paths 112a-112d. In one embodiment, distribution circuit 104 includes a plurality of transistors that controllably direct voltage pulses to each of the memory cells 106a-106d. In other embodiments, write pulse generator 102 provides current pulses to distribution circuit 104 via write pulse path 110 and distribution circuit 104 controllably directs the current pulses to memory cells 106a-106d via cell paths 112a-112d.

Sense circuit 108 reads each of the more than two states of memory cells 106a-106d via sense path 114. Distribution circuit 104 controllably directs read signals between sense circuit 108 and memory cells 106a-106d via cell paths 112a-112d. In one embodiment, distribution circuit 104 includes a plurality of transistors that controllably direct read signals between sense circuit 108 and memory cells 106a-106d. In one embodiment, to read the resistance of one of the memory cells 106a-106d, sense circuit 108 provides current that flows through one of the memory cells 106a-106d and sense circuit 108 reads the voltage across that one of the memory cells 106a-106d. In one embodiment, sense circuit 108 provides voltage across one of the memory cells 106a-106d and reads the current that flows through that one of the memory cells 106a-106d. In one embodiment, write pulse generator 102 provides voltage across one of the memory cells 106a-106d and sense circuit 108 reads the current that flows through that one of the memory cells 106a-106d. In one embodiment, write pulse generator 102 provides current through one of the memory cells 106a-106d and sense circuit 108 reads the voltage across that one of the memory cells 106a-106d.

In operation of one embodiment, write pulse generator 102 resets the phase-change material in memory cells 106a-106d. A reset operation includes heating the phase-change material of the target memory cell above its melting temperature and quickly cooling the phase-change material to thereby achieve a substantially amorphous state. This amorphous state is one of the more than two states of each of the memory cells 106a-106d and is the highest resistance state.

Write pulse generator 102 is configured to provide multiple sequential pulses to program a selected one of the more than two states into a selected one of the memory cells 106a-106d. Write pulse generator 102 provides a pulse to the selected one of the memory cells 106a-106d to crystallize part of the phase-change material and thereby lower the resistance of the selected one of the memory cells 106a-106d. Sense circuit 108 reads the resistance of the selected one of the memory cells 106a-106d and provides signals that indicate the sensed resistance value to write pulse generator 102. If the resistance value is higher than the selected one of the more than two states, write pulse generator 102 provides another pulse to the selected one of the memory cells 106a-106d to crystallize more of the phase-change material and thereby further lower the resistance of the selected one of the memory cells 106a-106d. Sense circuit 108 reads the resistance of the selected one of the memory cells 106a-106d and provides the sensed resistance value to write pulse generator 102. This continues until the resistance value is lower than an upper limit of the resistance value of the selected one of the more than two states.

Next, if the resistance value is higher than a lower limit of the resistance value of the selected one of the more than two states, write pulse generator 102 is done programming the selected one of the memory cells 106a-106d. If the resistance value is lower than the lower limit of the resistance value of the selected one of the more than two states, the programming sequence is repeated from the beginning, wherein write pulse generator 102 resets the phase-change material in the selected one of the memory cells 106a-106d and provides a pulse to begin programming the selected one of the memory cells 106a-106d.

In operation of another embodiment, write pulse generator 102 sets the phase-change material in memory cells 106a-106d. A set operation includes heating the phase-change material of the target memory cell above its crystallization temperature, but below its melting temperature, long enough to achieve a crystalline state. This crystalline state is one of the more than two states of each of the memory cells 106a-106d and is the lowest resistance state.

Write pulse generator 102 is configured to provide a pulse with a calculated amplitude, duration, and/or shape to program a selected one of the more than two states into a selected one of the memory cells 106a-106d. Write pulse generator 102 provides a pulse to the selected one of the memory cells 106a-106d to melt and quickly cool part of the phase-change material and thereby achieve an amorphous state in that part of the phase-change material, which raises the resistance of the selected one of the memory cells 106a-106d. Sense circuit 108 reads the resistance of the selected one of the memory cells 106a-106d and provides signals that indicate the sensed resistance value to write pulse generator 102. If the resistance value is between an upper limit and a lower limit of the selected one of the more than two states, write pulse generator 102 is done programming the selected one of the memory cells 106a-106d. If the resistance value is higher than the upper limit-or lower than the lower limit of the selected one of the more than two states, the pulsing sequence is repeated. In one embodiment, to repeat the pulsing sequence, write pulse generator 102 sets the phase-change material in the selected one of the memory cells 106a-106d and provides another calculated pulse to program the selected one of the memory cells 106a-106d. In order to adjust for the overshoot or undershoot of the targeted resistance value, the pulse parameters are recalculated and adjusted. For example, if the cell resistance value is too low, the pulse amplitude may be increased, and if the cell resistance value is too high, the pulse amplitude may be decreased.

In operation of another embodiment, write pulse generator 102 resets the phase-change material in memory cells 106a-106d, which includes heating the phase-change material of the target memory cell above its melting temperature and quickly cooling the phase-change material to thereby achieve a substantially amorphous state. This amorphous state is one of the more than two states of each of the memory cells 106a-106d and is the highest resistance state.

Write pulse generator 102 provides a pulse to program a selected one of the more than two states into a selected one of the memory cells 106a-106d. Write pulse generator 102 provides the pulse to the selected one of the memory cells 106a-106d to crystallize part of the phase-change material and thereby lower the resistance of the selected one of the memory cells 106a-106d.

In one embodiment, the pulse is a voltage pulse and sense circuit 108 senses current flowing through the phase-change material of the selected one of the memory cells 106a-106d during the duration of the voltage pulse. The level of the current corresponds to the temperature induced within the phase-change material and the amount of phase-change material crystallized. In another embodiment, the pulse is a current pulse and sense circuit 108 senses voltage across the selected one of the memory cells 106a-106d during the current pulse. The level of the voltage corresponds to the temperature induced within the phase-change material and the amount of phase-change material crystallized.

Sense circuit 108 senses the resistance value of a memory cell during the pulse, referred to as the present resistance value or present state of the memory cell, and provides signals that indicate, reaching the selected one of the more than two states. Write pulse generator 102 receives the signals and adjusts the pulse length of the pulse, such as by terminating the pulse, based on the signals.

In operation of another embodiment, write pulse generator 102 sets the phase-change material in memory cells 106a-106d, which includes heating the phase-change material of the target memory cell above its crystallization temperature, but below its melting temperature, long enough to achieve a crystalline state. This crystalline state is one of the more than two states of each of the memory cells 106a-106d and is the lowest resistance state.

Write pulse generator 102 is configured to provide a pulse to program a selected one of the more than two states into a selected one of the memory cells 106a-106d. Write pulse generator 102 provides the pulse to the selected one of the memory cells 106a-106d to melt and quickly cool part of the phase-change material and thereby achieve an amorphous state in that part of the phase-change material, which raises the resistance of the selected one of the memory cells 106a-106d.

In one embodiment, the pulse is a voltage pulse and sense circuit 108 senses current flowing through the phase-change material of the selected one of the memory cells 106a-106d during the voltage pulse. The level of current corresponds to the temperature induced within the phase-change material and the amount of phase-change material that has achieved an amorphous state. In another embodiment, the pulse is a current pulse and sense circuit 108 senses voltage across the selected one of the memory cells 106a-106d during the current pulse. The level of the voltage corresponds to the temperature induced within the phase-change material and the amount of phase-change material that has achieved an amorphous state.

Sense circuit 108 senses the present resistance value or present state of the memory cell during the pulse and provides signals that indicate reaching the selected one of the more than two states. Write pulse generator 102 receives the signals and adjusts the pulse length of the pulse, such as by terminating the pulse, based on the signals.

Figure 2:
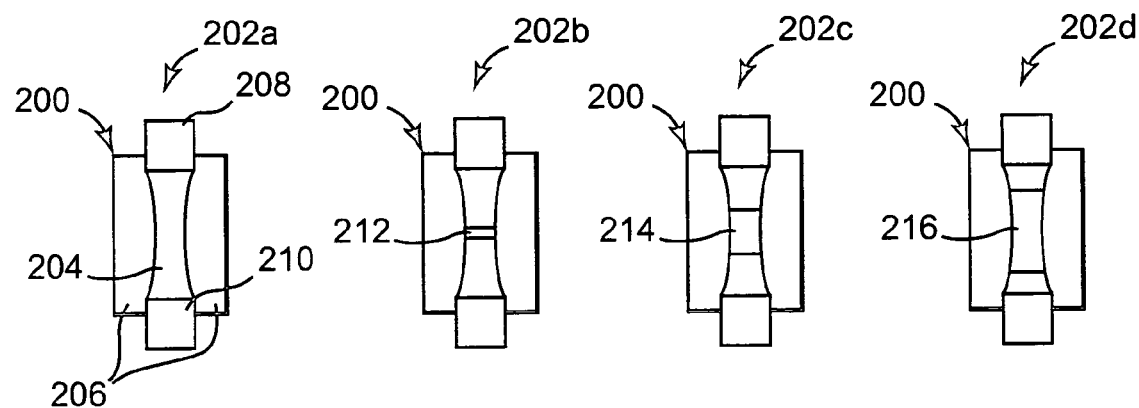
FIG. 2 is a diagram illustrating one embodiment of a memory cell in four different states.

FIG. 2 is a diagram illustrating one embodiment of a memory cell 200 in four different states at 202a, 202b, 202c, and 202d. Memory cell 200 includes a phase-change material at 204 that is situated in insulation material 206. Phase-change material 204 is an elongated strip of material that is thinner in the middle and wider at the ends. Insulation material 206 is rectangular shaped. In other embodiments, memory cell 200 can have any suitable geometry including phase-change material 204 in any suitable geometry and insulation material 206 in any suitable geometry.

Phase-change material 204 is electrically coupled at one end to a first electrode 208 and at the other end to a second electrode 210. Pulses are provided to memory cell 200 via first and second electrodes 208 and 210. The current path through phase-change material 204 is from one of the first and second electrodes 208 and 210 to the other one of the first and second electrodes 208 and 210. In one embodiment, each of the memory cells 106a-106d is similar to memory cell 200.

Memory cell 200 provides a storage location for storing bits of data. Insulation material 206 can be any suitable insulator, such as SiO2, and first and second electrodes 208 and 210 can be any suitable electrode material, such as TiN. Phase-change material 204 may be made up of a variety of materials, such as chalcogenide alloys that contain one or more elements from column IV of the periodic table. In one embodiment, phase-change material 204 of memory cell 200 is made up of a chalcogenide compound material, such as GeSbTe or AgInSbTe. In another embodiment, the phase-change material 204 can be chalcogen free such as GeSb, GaSb, SbTe, or GeGaSb. In other embodiments, the phase-change material 204 can be doped chalcogenide or chalcogenide-free phase-change materials.

Phase-change material 204 is programmed into one of four states to store two bits of data. A selection device, such as an active device like a transistor or diode, is coupled to first electrode 208 to control the application of pulses to phase-change material 204. The pulses set phase-change material 204 and program the other three states into phase-change material 204. At 202b, a small middle region 212 of phase-change material 204 in memory cell 200 has been programmed to change the resistance through phase-change material 204 and memory cell 200. At 202c, a medium sized middle region 214 of phase-change material 204 in memory cell 200 has been programmed to change the resistance through phase-change material 204 and memory cell 200. At 202d, a large middle region 216 of phase-change material 204 in memory cell 200 has been programmed to change the resistance through phase-change material 204 and memory cell 200. The size of the middle region is related to the resistance through phase-change material 204 and memory cell 200. The three different sized middle region states at 202b-202d plus the initial state at 202a provide four states in phase-change material 204, and memory cell 200 provides a storage location for storing two bits of data. In one embodiment, the state of memory cell 200 at 202a is a "00", the state of memory cell 200 at 202b is a "01", the state of memory cell 200 at 202c is a "10", and the state of memory cell 200 at 202d is a "11".

At 202a, phase-change material 204 is set to a crystalline state. During a set operation of memory cell 200, a set pulse is selectively enabled to first electrode 208 thereby heating phase-change material 204 above its crystallization temperature, but below its melting temperature. In this way, essentially all of phase-change material 204 reaches a crystalline state during the set operation. If memory cell 200 is in the crystalline state at 202a, memory cell 200 is in the lowest resistance state.

To program phase-change material 204 into one of the other three states 202b-202d, one or more pulses are provided via a write pulse generator, such as write pulse generator 102. At 202b, one or more pulses are provided to program the small middle region at 212 into an amorphous state. The amorphous state is more resistive than the crystalline state and memory cell 200 at 202b has a higher resistance than memory cell 200 in the crystalline state at 202a. At 202c, one or more pulses are provided to program the middle region at 214 into an amorphous state. Since the middle region at 214 is larger than the small middle region at 212 and the amorphous state is more resistive than the crystalline state, memory cell 200 at 202c has a higher resistance than memory cell 200 at 202b and memory cell 200 in the crystalline state at 202a. At 202d, one or more pulses are provided to program the large middle region at 216 into the amorphous state. Since the large middle region at 216 is larger than the middle region at 214 and the amorphous state is more resistive than the crystalline state, memory cell 200 at 202d has a higher resistance than memory cell 200 at 202c, memory cell 200 at 202b, and memory cell 200 in the crystalline state at 202a. Memory cell 200 at 202d is at the highest resistance state. In other embodiments, memory cell 200 can be programmed into any suitable number of resistance values or states.

Figure 3:
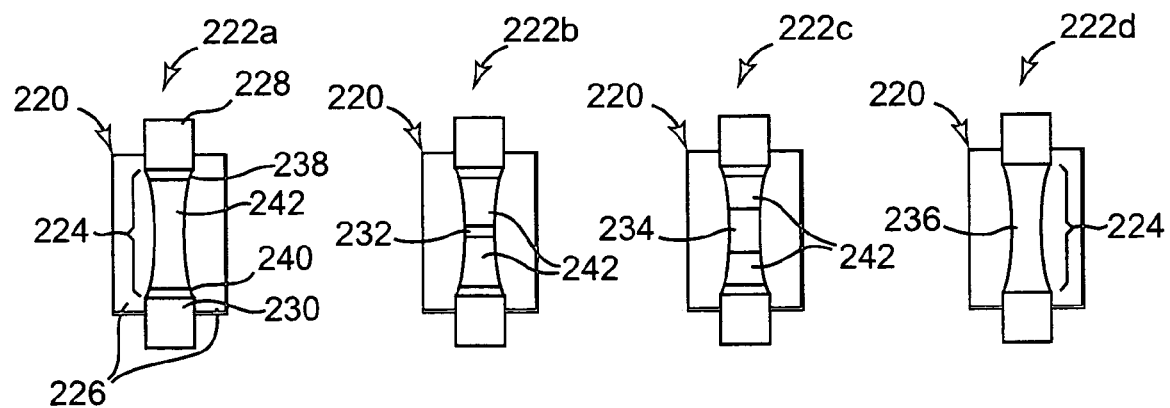
FIG. 3 is a diagram illustrating another embodiment of a memory cell in four different states.

FIG. 3 is a diagram illustrating one embodiment of a memory cell 220 in four different states at 222a, 222b, 222c, and 222d. Memory cell 220 includes a phase-change material at 224 that is situated in insulation material 226. Phase-change material 224 is an elongated strip of material that is thinner in the middle and wider at the ends. Insulation material 226 is rectangular shaped. In other embodiments, memory cell 220 can have any suitable geometry including phase-change material 224 in any suitable geometry and insulation material 226 in any suitable geometry.

Phase-change material 224 is electrically coupled at one end to a first electrode 228 and at the other end to a second electrode 230. Pulses are provided to memory cell 220 via first and second electrodes 228 and 230. The current path through phase-change material 224 is from one of the first and second electrodes 228 and 230 to the other one of the first and second electrodes 228 and 230. In one embodiment, each of the memory cells 106a-106d is similar to memory cell 220.

Memory cell 220 provides a storage location for storing bits of data. Insulation material 226 can be any suitable insulator, such as SiO2, and first and second electrodes 228 and 230 can be any suitable electrode material, such as TiN. Phase-change material 224 may be made up of a variety of materials, such as chalcogenide alloys that contain one or more elements from column IV of the periodic table. In one embodiment, phase-change material 224 of memory cell 220 is made up of a chalcogenide compound material, such as GeSbTe or AgInSbTe. In another embodiment, the phase-change material 224 can be chalcogen free such as GeSb, GaSb, SbTe, or GeGaSb. In other embodiments, the phase-change material 224 can be doped chalcogenide or chalcogenide-free phase-change materials.

Phase-change material 224 is programmed into one of four states to store two bits of data. A selection device, such as an active device like a transistor or diode, is coupled to first electrode 228 to control the application of pulses to phase-change material 224. The pulses reset phase-change material 224 and program the other three states into phase-change material 224. At 222b, a small middle region 232 of phase-change material 224 has been programmed to change the resistance through phase-change material 224 and memory cell 220. At 222c, a medium sized middle region 234 of phase-change material 224 has been programmed to change the resistance through phase-change material 224 and memory cell 220. At 222d, a large middle region 236, which is substantially all of phase-change material 224, has been programmed to change the resistance through phase-change material 224 and memory cell 220. The size of the programmed middle region is related to the resistance through phase-change material 224 and memory cell 220. The three different sized middle region states at 222b-222d plus the initial state at 222a provide four states in phase-change material 224, and memory cell 220 provides a storage location for storing two bits of data. In one embodiment, the state of memory cell 220 at 222a is a "00", the state of memory cell 220 at 222b is a "01", the state of memory cell 220 at 222c is a "10", and the state of memory cell 220 at 222d is a "11".

At 222a, phase-change material 224 is reset to a substantially amorphous state. During a reset operation of memory cell 220, a reset pulse is selectively enabled by the selection device and sent through first electrode 228 and phase-change material 224. The reset pulse heats phase-change material 224 above its melting temperature and phase-change material 224 is quickly cooled to achieve the substantially amorphous state at 222a. After a reset operation, phase-change material 224 includes crystalline state phase-change material at 238 and 240, and amorphous state phase-change material at 242. The substantially amorphous state at 222a is the highest resistance state of memory cell 220.

Figure 4:
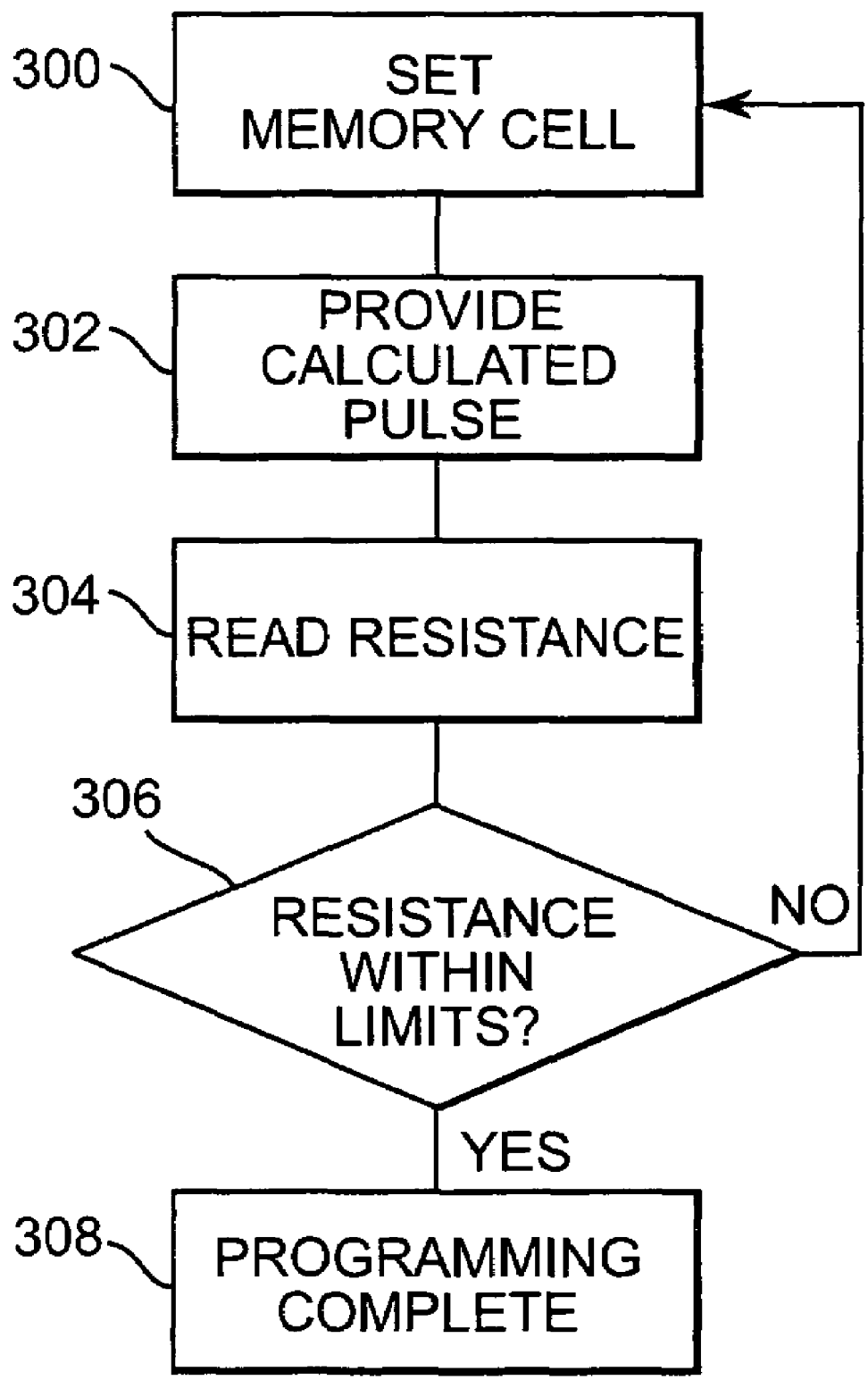
FIG. 4 is a diagram illustrating one example of programming one embodiment of a memory cell.

To program phase-change material 224 into one of the other three states 222b-222d, one or more pulses are provided via a write pulse generator, such as write pulse generator 102. At 222b, one or more pulses are provided to program the small middle region at 232 into a crystalline state. The crystalline state is less resistive than the amorphous state and memory cell 220 at 222b has a lower resistance than memory cell 220 in the substantially amorphous state at 222a. At 222c, one or more pulses are provided to program the middle region at 234 into a crystalline state. Since the middle region at 234 is larger than the small middle region at 232 and the crystalline state is less resistive than the amorphous state, memory cell 220 at 222c has a lower resistance than memory cell 220 at 222b and memory cell 220 in the amorphous state at 222a. At 222d, one or more pulses are provided to program the large middle region at 236 into the crystalline state. Since the large middle region at 236 is larger than the middle region at 234 and the crystalline state is less resistive than the amorphous state, memory cell 230 at 232d has a lower resistance than memory cell 220 at 222c, memory cell 220 at 222b, and memory cell 220 in the amorphous state at 222a. Memory cell 220 at 222d is in the lowest resistance state. In other embodiments, memory cell 220 can be programmed into any suitable number of resistance values or states FIG. 4 is a diagram illustrating one example of programming one embodiment of memory cell 200 that is in memory device 100. In this example, phase-change material 204 is set to a crystalline state at 202a and either left in the crystalline state at 202a or programmed to have an amorphous middle region at 212, 214, or 216 in one of the other three states 202b, 202c, or 202d, respectively. At 300, write pulse generator 102 sets phase-change material 204 in memory cell 200. The set operation includes heating phase-change material 204 above its crystallization temperature, but below its melting temperature, long enough to achieve the crystalline state at 202a. The crystalline state at 202a is the lowest resistance state.

To program a selected one of the other three states at 202b-202d into memory cell 200, write pulse generator 102 provides a calculated pulse at 302 with a calculated amplitude, duration, and/or shape to memory cell 200 to create an amorphous region in phase-change material 204 and thereby raise the resistance of memory cell 200. At 304, sense circuit 108 reads the resistance of memory cell 200 and provides signals that indicate the sensed resistance value to write pulse generator 102 via signal path 116. At 306, if the sensed resistance value is between upper and lower limits of the selected state, write pulse generator 102 is done programming memory cell 200 and programming is complete at 308. If the resistance value is higher than the upper limit or lower than the lower limit of the selected state, the programming sequence is repeated at 300. In one embodiment, to repeat the programming sequence, write pulse generator 102 sets the phase-change material 204 in memory cell 200 at 300 and continues by providing another calculated pulse with adjusted parameters at 302.

Figure 5:
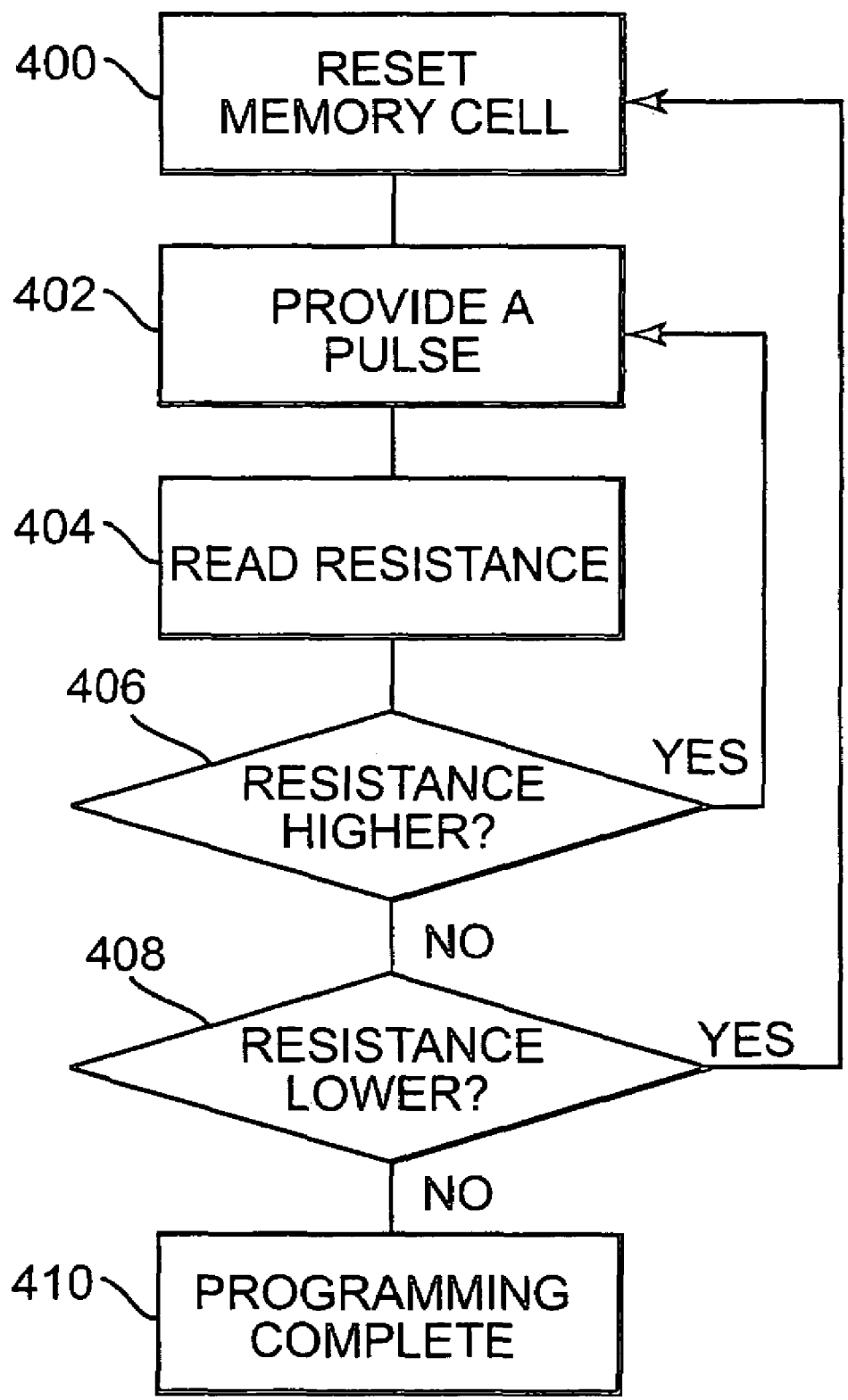
FIG. 5 is a diagram illustrating another example of programming one embodiment of a memory cell.

FIG. 5 is a diagram illustrating one example of programming one embodiment of memory cell 220 that is in memory device 100. In this example, phase-change material 224 is reset to the substantially amorphous state at 222a and either left in the amorphous state at 222a or programmed to have a crystalline middle region at 232, 234, or 236 in one of the other three states 222b, 222c, or 222d, respectively. At 400, write pulse generator 102 provides a pulse that resets phase-change material 224 in memory cell 220. The reset operation includes heating phase-change material 224 above its melting temperature and quickly cooling phase-change material 224 to thereby achieve the substantially amorphous state at 222a. The substantially amorphous state at 222a is the highest resistance state of memory cell 220.

To program a selected one of the other three states at 222b-222d into memory cell 220, write pulse generator 102 provides a pulse at 402 to memory cell 220 to crystallize part of the phase-change material 224 and thereby lower the resistance of memory cell 220. At 404, sense circuit 108 reads the resistance of memory cell 220 and provides signals that indicate the sensed resistance value to write pulse generator 102 via signal path 116. At 406, if the sensed resistance value is higher than an upper limit of the selected state, write pulse generator 102 provides another pulse at 402 to memory cell 220 to crystallize more of the phase-change material 224 and thereby further lower the resistance of memory cell 220. At 404, sense circuit 108 reads the resistance of memory cell 220 and provides the sensed resistance value to write pulse generator 102. This continues until the resistance value at 406 is lower than the upper limit of the selected state.

At 408, if the sensed resistance value is lower than the lower limit of the selected state, the programming sequence is repeated from the beginning at 400. Write pulse generator 102 resets phase-change material 224 at 400 in memory cell 220 and provides a pulse at 402 to begin programming memory cell 220. At 408, if the sensed resistance value is higher than a lower limit of the selected state, write pulse generator 102 is done programming memory cell 220 and programming is complete at 410.

In another embodiment, checking to see if the resistance value is lower than the lower limit of the selected state at 408 is not done. Instead, write pulse generator 102 is done programming memory cell 220 and programming is complete at 410 after the resistance value at 406 is lower than the upper limit of the selected state.

Figure 6:
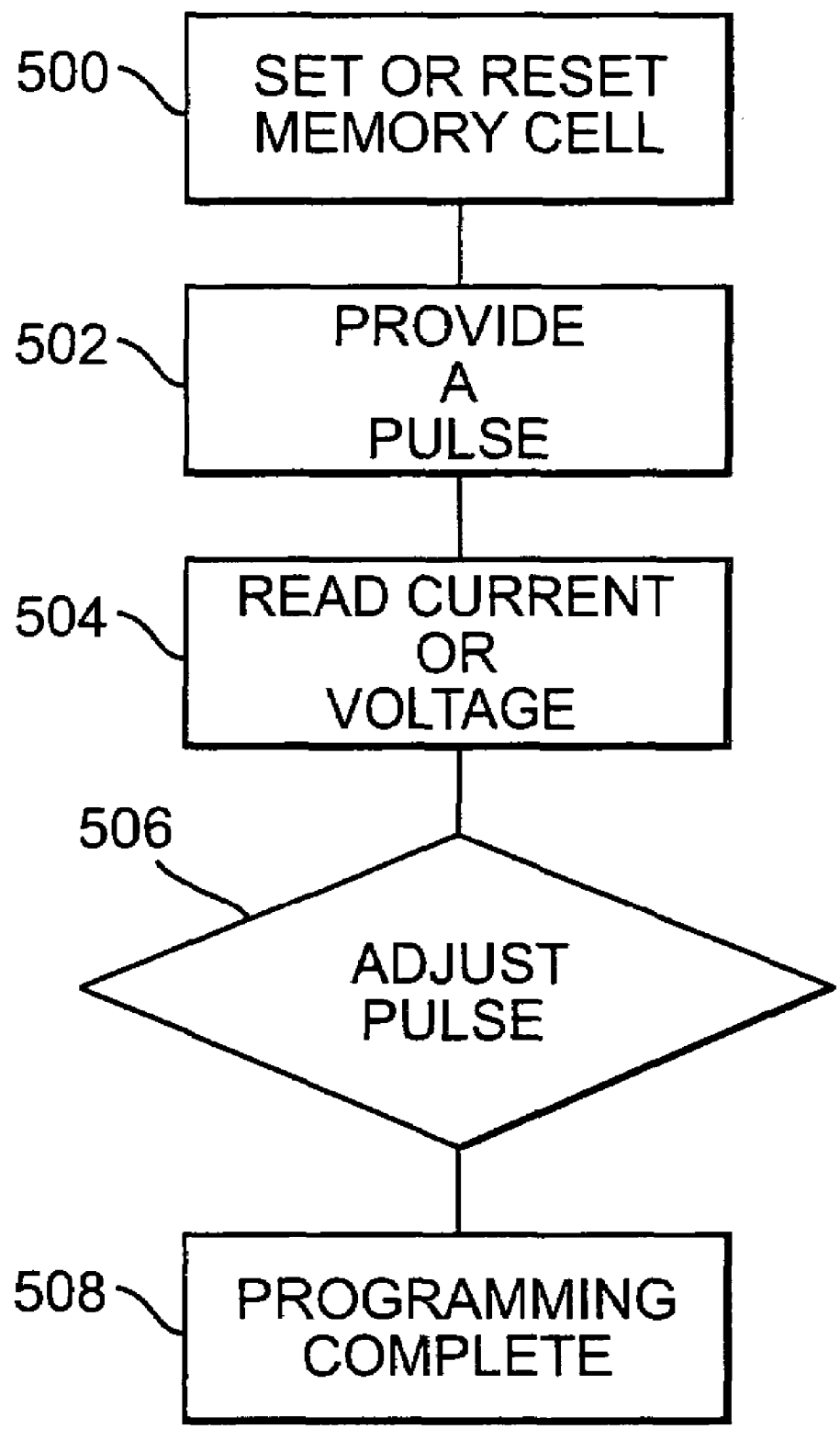
FIG. 6 is a diagram illustrating another example of programming a memory cell.

FIG. 6 is a diagram illustrating another example of programming one embodiment of a memory cell, such as memory cell 200 or memory cell 220, in memory device 100. This programming method is used to either reset phase-change material 224 to the substantially amorphous state at 222a and program in crystalline middle regions at 232, 234, or 236 to achieve the other three states 222b-222d or to set phase-change material 204 to the crystalline state at 202a and program in amorphous middle regions at 212, 214, or 216 to achieve the other three states 202b, 202c, or 202d. In other embodiments, this method can be used to program any suitable number of resistance levels or states into memory cells 200 or memory cells 220.

At 500, write pulse generator 102 sets memory cell 200 or resets memory cell 220. At 502, write pulse generator 102 provides a pulse to program a selected one of the other three states 202b-202d into memory cell 200 or a selected one of the other three states 222b-222d into memory cell 220. Write pulse generator 102 provides the pulse to memory cell 220 to create crystalline middle regions at 232, 234, or 236 in phase-change material 224. Write pulse generator 102 provides the pulse to memory cell 200 to create amorphous middle regions at 212, 214, or 216 in phase change material 204.

At 504, sense circuit 108 senses a current that flows through the memory cell or a voltage across the memory cell during the application of the write pulse. In one embodiment, the pulse is a voltage pulse and, at 504, sense circuit 108 senses current flowing through the phase-change material, such as phase change material 204 or phase change material 224, during the voltage pulse. The level of the current corresponds to the temperature induced within the phase-change material and the size of the crystalline middle region or the size of the amorphous middle region in the phase change material. In another embodiment, the pulse is a current pulse and, at 504, sense circuit 108 senses voltage across the memory cell during the current pulse. The level of the voltage corresponds to the temperature induced within the phase-change material and the size of the crystalline middle region in phase-change material 224 or the size of the amorphous middle region in phase change material 204.

Sense circuit 108 provides signals that indicate the selected state has been reached in memory cell 200 or memory cell 220. Sense circuit 108 provides the signals to write pulse generator 102 via signal path 116. At 506, write pulse generator 102 receives the signals and adjusts the pulse length, such as by terminating the pulse, based on the signals. Programming is complete at 508.

Figure 7:
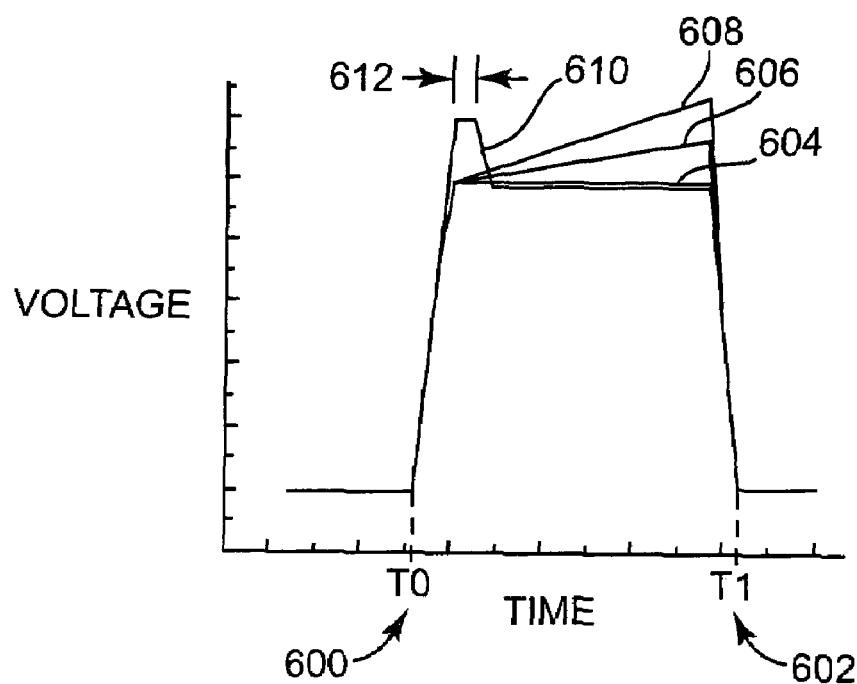
FIG. 7 is a diagram illustrating pulse shapes provided to a memory cell.

FIG. 7 is a diagram illustrating pulse shapes provided at 502 to memory cell 200 or memory cell 220. Write pulse generator 102 selects a pulse shape based on the selected state of the more than two states to be programmed into the memory cell. Each of the pulse shapes has a pulse length that extends from T0 at 600 until the pulse is terminated, such as at T1 at 602.

A flat pulse shape at 604 includes a substantially constant amplitude for the duration of the pulse length from T0 at 600 to T1 at 602. Other pulses include a slowly rising pulse at 606 and a faster rising pulse at 608. In rising pulses at 606 and 608, the pulse amplitude increases from T0 at 600 to T1 at 602. The faster rising pulse at 608 has an amplitude that increases at a faster rate than the amplitude of the slowly rising pulse at 606. An overshoot pulse at 610 includes an amplitude overshoot at the beginning of the pulse at 612 and a substantially flat amplitude characteristic following the overshoot at 612. The amplitude overshoot at 612 quickly charges parasitic capacitance and overcomes the threshold value of the phase-change material, such as phase-change material 204 or phase-change material 224. Also, the amplitude overshoot at 612 can be combined with any of the other pulses, including the slowly rising pulse at 606 and the faster rising pulse at 608, to provide a pulse with an initial amplitude overshoot and a rising amplitude characteristic. In other embodiments, the amplitude overshoot can be combined with any suitable pulse shape. In other embodiments, write pulse generator 102 can provide any suitable pulse shape.

Figure 8:
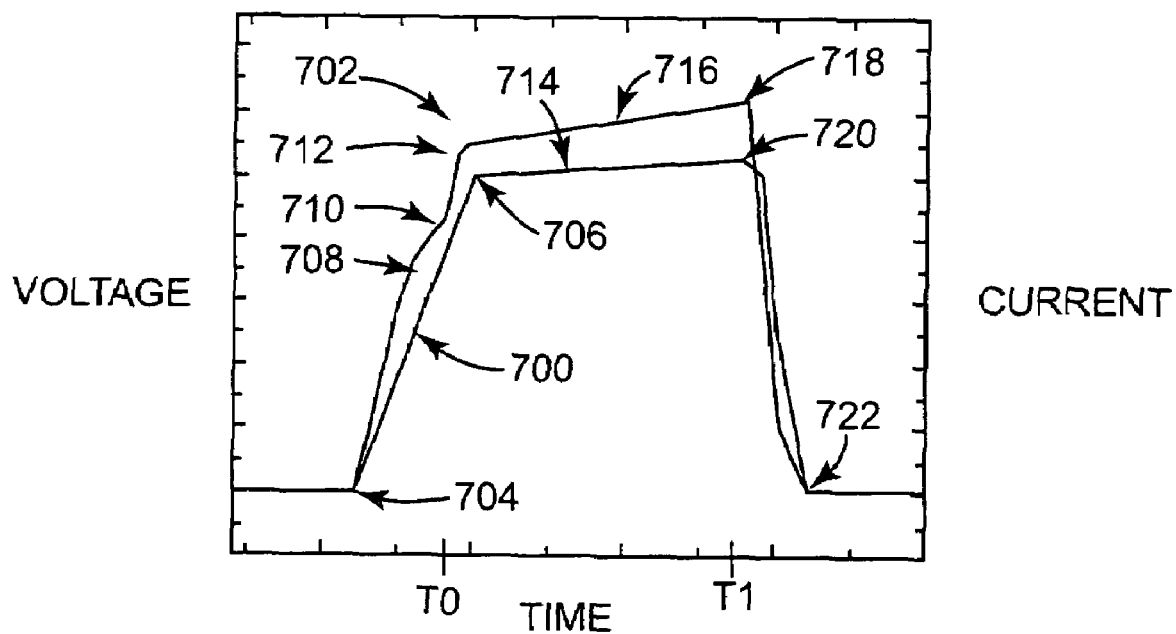
FIG. 8 is a timing diagram illustrating one embodiment of a programming voltage and a resulting current pulse in a memory cell.

FIG. 8 is a timing diagram illustrating one embodiment of a programming voltage pulse 700 and a resulting current pulse 702 in memory cell 220. In this example, phase-change material 224 is reset to the substantially amorphous state at 222a, which is the highest resistance state. Voltage pulse 700 is provided to crystallize a middle region in phase-change material 224 and lower the resistance of memory cell 220 to provide one of the other three states 222b-222d.

Write generator 102 provides voltage pulse 700, which begins at 704 and quickly ramps to the initial voltage amplitude at 706. During a first phase of voltage pulse 700 and current pulse 702, parasitic capacitances are charged as indicated by the curve at 708 in current pulse 702. At 710, the threshold voltage of phase-change material 224 is reached and as phase-change material 224 begins to crystallize, current pulse 702 increases to the initial current amplitude at 712.

Voltage pulse 700 is a rising pulse that increases in amplitude at 714 over a pulse length from T0 to T1. As voltage pulse 700 increases in amplitude, phase-change material 224 continues crystallizing and the resistance of memory cell 220 continues decreasing in value. The larger amplitude of voltage pulse 700 and the lower resistance of memory cell 220, result in current pulse 702 that increases in amplitude at 716.

Sense circuit 108 senses the amplitude of current pulse 702 as it flows through phase-change material 224 during voltage pulse 700. The amplitude of current pulse 702 corresponds to the temperature induced within phase-change material 224 and the amount of phase-change material 224 that is crystallized in memory cell 220. Sense circuit 108 senses the current amplitude endpoint at 718 and provides signals that indicate the selected state has been programmed into memory cell 220. Write pulse generator 102 receives the signals and adjusts the pulse length of voltage pulse 700. Voltage pulse 700 is terminated at 720 and decreases to a reference voltage, such as ground, at 722. In addition, current pulse 702 decreases to a reference current, such as zero, at 722 and programming of memory cell 220 is complete.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit having a resistive memory, comprising:
   a memory cell including resistivity changing material;
   a first circuit configured to program the resistivity changing material to one of more than two states; and
   a second circuit configured to sense a present state of the memory cell and to provide state signals that indicate the present state of the memory cell, wherein the first circuit receives the state signals and programs each of the more than two states into the memory cell based on the state signals.

2. The memory device of claim 1, wherein the first circuit terminates a programming pulse during application of the programming pulse to the resistivity changing material based on the state signals to program one of the more than two states into the memory cell.

3. The memory device of claim 1, wherein the first circuit is configured to provide multiple pulses based on the state signals to program one of the more than two states into the memory cell.

4. The memory device of claim 1, wherein the first circuit is configured to reset the resistivity changing material to an amorphous state and to program at least two crystalline states into the memory cell.

5. The memory device of claim 1, wherein the first circuit is configured to reset the resistivity changing material to a crystalline state and to program at least two amorphous states into the memory cell.

6. The memory device of claim 3, wherein the pulses include at least one of an overshoot at the beginning of a pulse and an increase in amplitude over a pulse length of a pulse.

7. A memory device, comprising:
   a memory cell including phase-change material;
   a first circuit configured to provide a pulse to the phase-change material to program the memory cell into one of more than two states of the memory cell; and
   a second circuit configured to sense the present state of the memory cell during application of the pulse to the phase-change material and provide a signal that indicates the one of the more than two states of the memory cell during application of the pulse to the phase-change material, wherein the first circuit receives the signal and terminates the pulse during application of the pulse to the phase-change material based on the signal to program the memory cell into the one of more than two states of the memory cell.

8. The memory device of claim 7, wherein the pulse includes at least one of an overshoot at the beginning of the pulse and an increase in amplitude over the pulse length.

9. The memory device of claim 7, wherein the pulse is a substantially flat pulse.

10. The memory device of claim 7, wherein the pulse is a voltage pulse and the second circuit is configured to sense current that flows through the phase-change material based on the voltage pulse and to provide the signals based on the sensed current.

11. The memory device of claim 7, wherein the pulse is a current pulse and the second circuit is configured to sense voltage across the phase-change material and to provide the signals based on the sensed voltage.

12. A memory device, comprising:
means for storing more than two states in a memory cell;
means for pulsing the memory cell to program each of the more than two states into the memory cell;
means for sensing each of the more than two states of the memory cell; and
means for controlling the pulsing based on sensing each of the more than two states of the memory cell.

13. The memory device of claim 12, wherein the means for controlling comprises:
means for terminating a pulse during application of the pulse to the memory cell based on sensing each of the more than two states of the memory cell to program one of the more than two states into the memory cell.

14. The memory device of claim 12, wherein the means for controlling comprises:
means for providing multiple pulses based on sensing each of the more than two states of the memory cell to program one of the more than two states into the memory cell.

15. The memory device of claim 12, wherein the means for pulsing comprises means for providing a voltage pulse and the means for sensing comprises means for sensing a current that flows through phase-change material based on the voltage pulse.

16. The memory device of claim 12, wherein the means for pulsing comprises means for providing a current pulse and the means for sensing comprises means for sensing a voltage across phase-change material.

17. A method of writing a resistive memory cell of an integrated circuit, comprising:
programming resistivity changing material of the resistive memory cell to one of more than two states;
sensing a present state of the memory cell; and
providing state signals that indicate the present state of the memory cell, wherein programming the resistivity changing material comprises:
receiving the state signals; and
programming based on the received state signals.

18. The method of claim 17, wherein programming the resistivity changing material includes:
pulsing the resistivity changing material to program each of the more than two states into the memory cell; and
adjusting a pulse length of a pulse during application of the pulse to the resistivity changing material based on the state signals.

19. The method of claim 17, wherein programming the resistivity changing material includes providing multiple pulses to the resistivity changing material based on the state signals.

20. A method of writing a memory cell, comprising:
pulsing the memory cell to program one of more than two states into the memory cell;
sensing the one of the more than two states during application of a pulse for programming the one of the more than two states into the memory cell; and terminating the pulse based on the sensing of the one of the more than two states during application of the pulse.

21. The method of claim 20, comprising one of:
resetting phase-change material to an amorphous state and programming one of at least two crystalline states into the phase-change material; and
setting phase-change material to a crystalline state and programming one of at least two amorphous states into the phase-change material.

22. The method of claim 20, wherein pulsing the memory cell comprises providing a voltage pulse, and sensing the one of the more than two states comprises sensing a current that flows through phase-change material based on the voltage pulse.

23. The method of claim 20, wherein pulsing the memory cell comprises providing a current pulse, and sensing the one of the more than two states comprises sensing a voltage across phase-change material.

24. A method of writing a memory cell, comprising:
providing a pulse to phase-change material to program the memory cell into one of more than two states;
sensing the present state of the phase-change material;
providing signals that indicate the present state of the phase-change material during application of the pulse; and
adjusting pulse length of the pulse based on the signals, wherein adjusting pulse length comprises:
terminating the pulse during application of the pulse to the phase-change material based on the signals to program the memory cell into the one of more than two states of the memory cell.

25. The method of claim 24, wherein providing the pulse comprises:
increasing amplitude of the pulse over the pulse length.

26. The method of claim 24, wherein providing the pulse comprises:
providing a substantially flat pulse.

27. The method of claim 24, wherein providing the pulse comprises:
overshooting at the beginning of the pulse.

28. A method of writing a memory cell, comprising:
setting phase-change material of the memory cell to a crystalline state;
calculating pulse parameters of a pulse to program one of more than two amorphous states into the memory cell;
pulsing the phase-change material of the memory cell via the pulse;
reading a resistance value of the memory cell to obtain a signal that indicates the resistance value;
re-setting the phase-change material of the memory cell to the crystalline state based on the signal; and
repulsing the phase-change material of the memory cell based on the signal to program the one of more than two amorphous states into the memory cell.

29. The method of claim 28, wherein repulsing the phase-change material comprises:
   recalculating pulse parameters of an other pulse based on the resistance value; and
   pulsing the phase-change material of the memory cell via the other pulse to program the one of more than two amorphous states into the memory cell.

30. The method of claim 29, wherein recalculating pulse parameters comprises:
   recalculating at least one of pulse amplitude, pulse duration, and pulse shape based on the resistance value.

31. The method of claim 28, wherein calculating pulse parameters comprises:
   calculating at least one of pulse amplitude, pulse duration, and pulse shape.

32. A method of writing a memory cell, comprising:
   resetting phase-change material of the memory cell to an amorphous state;
   pulsing the phase-change material of the memory cell via a pulse to program one of more than two crystalline states into the memory cell;
   reading a resistance value of the memory cell to obtain a signal that indicates the resistance value; and
   repulsing the phase-change material of the memory cell via another pulse based on the signal, if the resistance value is above an upper limit of the one of more than two crystalline states.

33. The method of claim 32, comprising:
   resetting the phase-change material of the memory cell to an amorphous state based on the resistance value being below a lower limit of the one of more than two crystalline states.

34. The method of claim 33, comprising:
   pulsing the phase-change material of the memory cell to program the one of more than two crystalline states into the memory cell after resetting the phase-change material of the memory cell to an amorphous state based on the resistance value being below a lower limit of the one of more than two crystalline states.

35. A memory device comprising:
   a memory cell including resistivity changing material;
   means for programming the resistivity changing material to one of more than two states; and
   means for sensing a present state of the memory cell to provide state signals indicative of the present state of the memory cell, wherein the means for programming comprises:
   means for applying a pulse to the resistivity changing material; and
   means for terminating the pulse based on the state signals to program the one of the more than two states into the memory cell.

36. The memory device of claim 35, wherein the means for programming includes means for resetting the resistivity changing material to an amorphous state and for programming at least two crystalline states into the memory cell.

37. The memory device of claim 35, wherein the means for programming includes means for resetting the resistivity changing material to a crystalline state and for programming at least two amorphous states into the memory cell.

* * * * *